US012626752B2

(12) United States Patent
Jang et al.

(10) Patent No.: US 12,626,752 B2
(45) Date of Patent: May 12, 2026

(54) SENSE AMPLIFIER AND METHOD OF OPERATION THEREOF

(71) Applicant: SAMSUNG ELECTRONICS CO., LTD., Suwon-si (KR)

(72) Inventors: Miji Jang, Suwon-si (KR); Younghun Seo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 137 days.

(21) Appl. No.: 18/887,289

(22) Filed: Sep. 17, 2024

(65) Prior Publication Data

US 2025/0218498 A1     Jul. 3, 2025

(30) Foreign Application Priority Data

Dec. 28, 2023     (KR) ........................ 10-2023-0195354

(51) Int. Cl.
*G11C 11/4091*     (2006.01)
*G11C 11/4094*     (2006.01)
*G11C 7/10*     (2006.01)

(52) U.S. Cl.
CPC ...... *G11C 11/4091* (2013.01); *G11C 11/4094* (2013.01); *G11C 7/1084* (2013.01)

(58) Field of Classification Search
CPC .................................................. G11C 7/1084
See application file for complete search history.

(56) References Cited

U.S. PATENT DOCUMENTS

| | | |
|---|---|---|
| 7,272,059 B2 | 9/2007 | Daniele et al. |
| 8,467,255 B2 * | 6/2013 | Kim ..................... G11C 7/1084 |
| | | 365/189.16 |
| 9,478,277 B1 | 10/2016 | Liu |
| 10,074,408 B2 | 9/2018 | Seo |
| 10,566,036 B2 | 2/2020 | Kawamura |
| 11,790,971 B2 | 10/2023 | Jung et al. |
| 2024/0029782 A1 | 1/2024 | Lee et al. |

FOREIGN PATENT DOCUMENTS

| | | |
|---|---|---|
| KR | 10-1698155 B1 | 1/2017 |
| KR | 10-2405521 B1 | 6/2022 |
| KR | 10-2023-0018112 A | 2/2023 |

* cited by examiner

*Primary Examiner* — Jason Lappas
(74) *Attorney, Agent, or Firm* — Morgan, Lewis & Bockius LLP

(57) ABSTRACT

A sense amplifier that senses and amplifies data stored in a memory cell includes a first sampling circuit that performs a sampling operation based on a first current, a second sampling circuit that performs a sampling operation based on a second current, and a sense amplification circuit configured to generate an offset compensation voltage that compensates for an offset between a first data output node and a second data output node through an offset compensation operation. Data stored in the memory cell may be read based on the magnitude of the current received from the memory cell, and the sensing time utilized to read data stored in the memory cell may be shortened.

20 Claims, 17 Drawing Sheets

SENSE AMPLIFIER AND METHOD OF OPERATION THEREOF

CROSS-REFERENCE TO RELATED APPLICATION

This application claims priority under 35 U.S.C. § 119 to Korean Patent Application No. 10-2023-0195354, filed on Dec. 28, 2023 in the Korean Intellectual Property Office, the disclosure of which is incorporated by reference herein in its entirety.

TECHNICAL FIELD

Embodiments of the inventive concept relate to a sense amplifier, and more particularly, to a sense amplifier capable of reading data based on a current provided through a bit line and a complementary bit line.

DISCUSSION OF RELATED ART

As technologies such as artificial intelligence and Internet of Things (IoT) advance, memory devices with high integration while operating at a faster speed are utilized. Dynamic Random Access Memory (DRAM), which is one of the types of memory devices, operates in a manner of writing and reading data by a charge stored in a memory cell.

A memory cell array of the DRAM may include memory cells connected to a bit line and a complementary bit line. When a read operation is performed, a sense amplifier may sense and amplify a voltage difference between the bit line and the complementary bit line.

SUMMARY

Embodiments of the inventive concept provide a sense amplifier capable of sensing data stored in a memory cell based on the magnitude of a current flowing through a bit line and a complementary bit line according to data stored in the memory cell.

According to an embodiment of the inventive concept, there is provided a sense amplifier that senses and amplifies data stored in a memory cell. The sense amplifier includes a first sampling circuit including a first bit line capacitor connected to a bit line, a first sampling transistor connected between the bit line and a first sampling node, and a first decoupling capacitor connected between the first sampling node and a first data output node. The first sampling circuit is configured to receive a first current through the bit line. The sense amplifier further includes a second sampling circuit including a second bit line capacitor connected to a complementary bit line, a second sampling transistor connected between the complementary bit line and a second sampling node, and a second decoupling capacitor connected between the second sampling node and a second data output node. The second sampling circuit is configured to receive a second current through the complementary bit line. The sense amplifier further includes a sense amplification circuit connected between the first data output node and the second data output node and configured to generate an offset compensation voltage that compensates for an offset between the first data output node and the second data output node through an offset compensation operation. The first sampling circuit is configured to provide, to the first data output node, a sampling voltage generated by performing a sampling operation based on a sampling control signal, and the sense amplification circuit performs the offset compensation operation while the first sampling circuit performs the sampling operation.

According to an embodiment of the inventive concept, there is provided a sense amplifier that senses and amplifies data stored in a memory cell. The sense amplifier includes a first sampling circuit including a first bit line capacitor connected to a bit line, a first sampling transistor connected between the bit line and a first sampling node, and a first decoupling capacitor connected between the first sampling node and a first data output node, and configured to receive a first current through the bit line. The sense amplifier further includes a second sampling circuit including a second bit line capacitor connected to a complementary bit line, a second sampling transistor connected between the complementary bit line and a second sampling node, and a second decoupling capacitor connected between the second sampling node and a second data output node, and configured to receive a second current through the complementary bit line. The sense amplifier further includes a first precharge transistor connected to the first sampling node and configured to provide a first precharge voltage to the first sampling node based on a precharge transistor control signal, a second precharge transistor connected to the second sampling node and configured to provide the first precharge voltage to the second sampling node based on the precharge transistor control signal. The sense amplifier further includes a sense amplification circuit connected between the first data output node and the second data output node and configured to generate an offset compensation voltage that compensates for an offset between the first data output node and the second data output node through an offset compensation operation. The first sampling circuit is configured to provide, to a first data output node, a sampling voltage generated by performing a sampling operation based on a sampling control signal. The sense amplification circuit performs the offset compensation operation while the first sampling circuit performs the sampling operation.

According to an embodiment of the inventive concept, there is provided a method of operating a sense amplifier that senses and amplifies data stored in a memory cell. The sense amplifier includes a first sampling circuit connected to a bit line, a second sampling circuit connected to a complementary bit line, and a sense amplification circuit connected between a first data output node and a second data output node. The method includes generating an offset compensation voltage that compensates for an offset between the first data output node and the second data output node, generating a sampling voltage corresponding to a voltage difference between the bit line and the complementary bit line, providing the sampling voltage to the first data output node based on a sampling control signal, performing a sensing operation of sensing data stored in a memory cell based on a difference between voltages of the first data output node and the second data output node, and performing a precharge operation by applying a precharge voltage to the sense amplifier.

BRIEF DESCRIPTION OF THE DRAWINGS

The above and other features of the inventive concept will become more apparent by describing in detail embodiments thereof with reference to the accompanying drawings, in which:

FIG. 3 is a block diagram illustrating a sense amplifier and a peripheral configuration of the sense amplifier according to an embodiment;

DETAILED DESCRIPTION OF THE EMBODIMENTS

Figure 1:
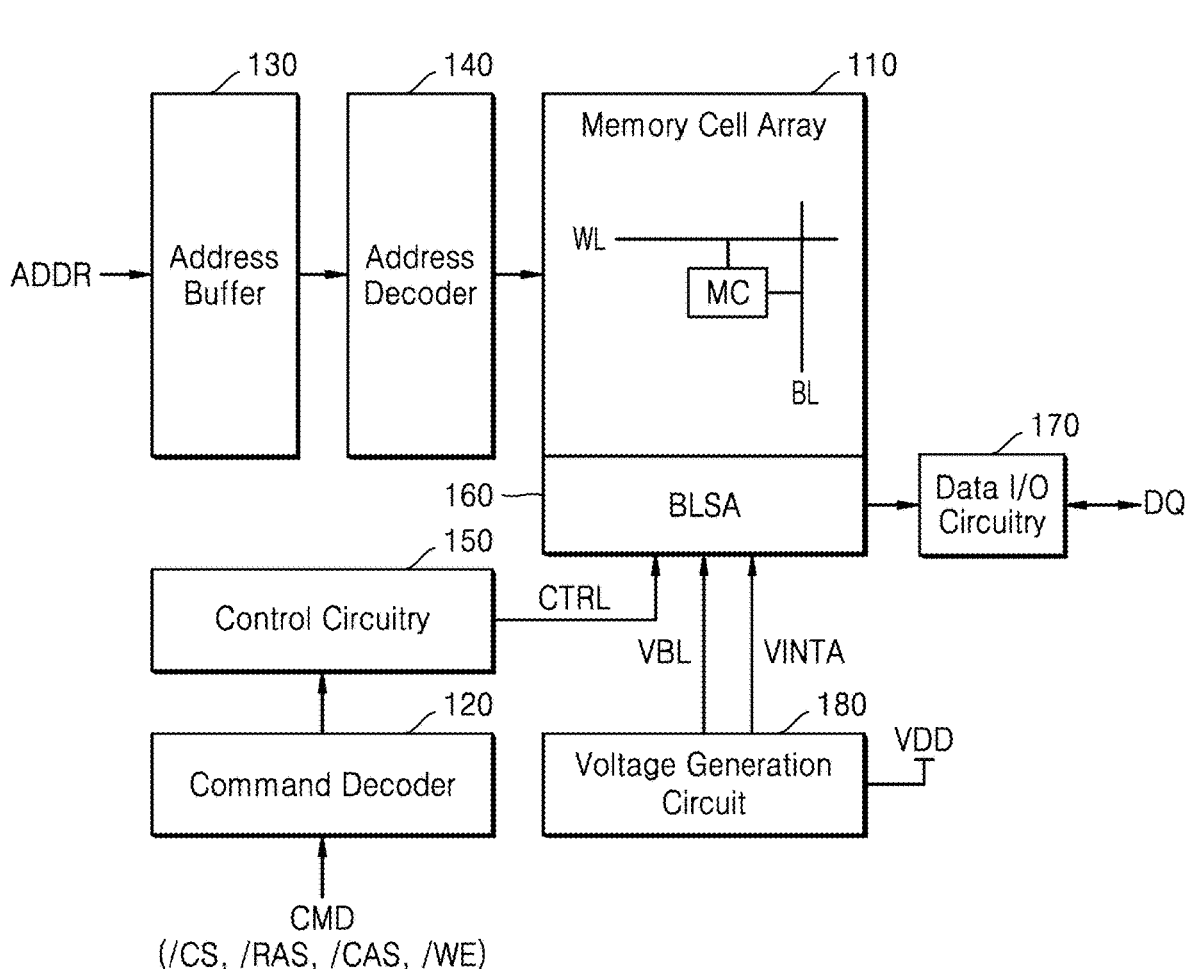
FIG. 1 is a block diagram illustrating a memory device according to an embodiment.

Embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. Other words used to describe the relationships between components should be interpreted in a like fashion.

FIG. 1 is a block diagram illustrating a memory device according to an embodiment.

Referring to FIG. 1, a memory device 100 according to an embodiment may include a memory cell array 110, a command decoder 120, an address buffer 130, an address decoder 140, control circuitry 150, a sense amplifier 160, data input/output (I/O) circuitry 170, and a voltage generation circuit 180. The sense amplifier 160 may also be referred to herein as a sense amplifier circuit.

The memory device 100 may be implemented as dynamic random access memory (DRAM) that senses and amplifies a state of data stored in a memory cell MC. For example, the memory device 100 may be implemented as Synchronous DRAM (SDRAM), Double Data Rate SDRAM (DDR SDRAM), Low Power DDR SDRAM (LPDDR SDRAM), Graphics DDR SDRAM (GDDR SDRAM), Wide I/O DRAM, High Bandwidth Memory (HBM), a Hybrid Memory Cube (HMC), or the like.

Data DQ may be input to or output from the memory device 100 in response to a command CMD and an address ADDR received from an external device (e.g., a central processing unit (CPU) or a memory controller). The memory cell array 110 may include a plurality of word lines WL, a plurality of bit lines BL, and a plurality of memory cells MC arranged at intersections of the plurality of word lines WL and the plurality of bit lines BL.

In an embodiment, each of the memory cells MC may have a one-transistor one capacitor (1T-1C) structure including a cell transistor and a cell capacitor. In this case, a gate of the cell transistor is connected to one of the word lines WL arranged in the row direction of the memory cell array 110. One end of the cell transistor is connected to one of the bit lines BL arranged in the column direction of the memory cell array 110, and the other end of the cell transistor is connected to the cell capacitor. The cell capacitor may store charges having a capacity corresponding to a data state. Each of the memory cells MC may store a voltage having a magnitude specifying data in the cell capacitor. According to an embodiment, the memory cell MC may store two or more bits of multi-bit data.

In an embodiment, each of the memory cells MC may be a ferroelectric random access memory cell. In this case, each of the memory cells MC may have a 1T-1C structure including a cell transistor and a cell capacitor. In this case, the ferroelectric material may be included in a dielectric layer of the cell capacitor.

In addition, each memory cell MC may have a 1T (one transistor) structure composed of a ferroelectric cell transistor. In this case, the transistor included in each of the memory cells MC may be referred to as a ferroelectric field effect transistor (FeFET). When each of the memory cells MC has a 1T structure, the degree of integration of the memory cell array 110 may be higher than when each of the memory cells MC has a 1T-1C structure. The FeFET may refer to a transistor including ferroelectrics in a gate oxide layer of a metal oxide semiconductor field effect transistor (MOSFET), and since each memory cell MC has a 1T structure, each memory cell MC may be referred to as a FeFET in the present disclosure. The structure and hysteresis of each of the memory cells MC are described below with reference to FIGS. 2A and 2B. In the present disclosure, it is assumed that each of the memory cells MC included in the memory cell array 110 is a memory cell having a 1T structure including FeFETs, but this is only an example for explanation, and embodiments are not limited thereto.

The command decoder 120 may determine an input command CMD with reference to a chip selection signal/CS, a row address strobe signal/RAS, a column address strobe signal/CAS, and a write enable signal/WE applied from an external device. The command decoder 120 may generate a signal(s) corresponding to the command CMD and provide the generated signal(s) to the control circuitry 150. The command CMD may include, for example, an active command, a read command, a write command, a precharge command, and the like.

The address buffer 130 receives an address ADDR applied from an external device. The address ADDR may include a row address that addresses a row of the memory cell array 110 and a column address that addresses a column of the memory cell array 110. The address buffer 130 may transmit each of the row address and the column address to the address decoder 140.

The address decoder 140 may include a row decoder and a column decoder that select the word line WL and the bit line BL of the memory cell MC to be accessed in response to the received address ADDR. The row decoder may decode the row address to activate the word line WL of the memory cell MC corresponding to the row address. The column decoder decodes the column address to provide a column selection signal for selecting a bit line BL of the memory cell corresponding to the column address.

The control circuitry 150 may control the sense amplifier 160 under the control of the command decoder 120. For example, the control circuitry 150 may selectively turn on or off the transistors included in the sense amplifier 160 through a control signal CTRL.

The sense amplifier 160 may sense data stored in the memory cells MC. In an embodiment, the sense amplifier 160 may sense data stored in the memory cells MC based on the magnitude of the current provided along the bit line and the complementary bit line. A detailed description in this regard is provided below with reference to FIGS. 3 to 7. In addition, the sense amplifier 160 may transmit the sensed data to the data input/output circuitry 170, and the sensed data may be output to the outside of the memory device 100 through a data pad.

The data input/output circuit 170 may receive data DQ to be written in the memory cells MC from the outside of the memory device 100 and transmit the data DQ to the memory cell array 110. The data input/output circuit 170 may output bit data sensed by the sense amplifier 160 to the outside of the memory device 100 through a data pad as read data.

The voltage generation circuit 180 may generate a precharge voltage VBL and an internal power voltage VINTA to be provided to the sense amplifier 160 by using the power voltage VDD of the memory device 100.

Figure 2A:
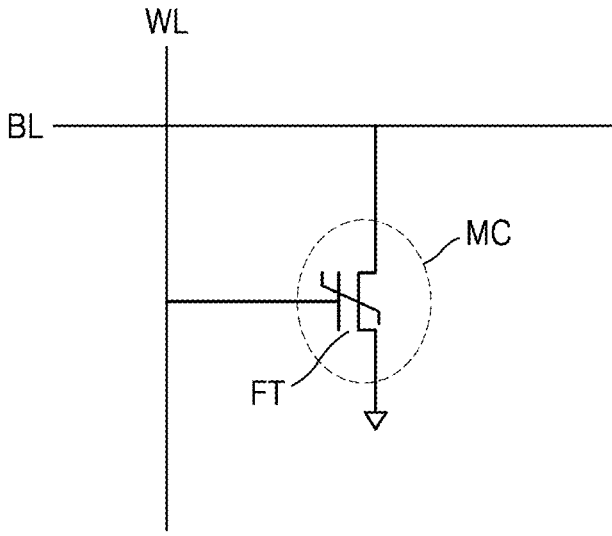
FIGS. 2A and 2B are graphs for describing respective memory cells according to an embodiment.
Figure 2B:
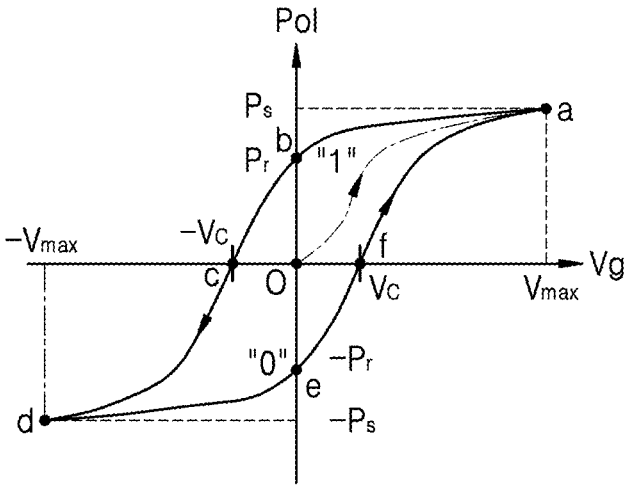

FIGS. 2A and 2B are diagrams for describing respective memory cells according to an embodiment. For example, FIG. 2A is a diagram for explaining the structure of a memory cell MC including a ferroelectric field effect transistor FT, and FIG. 2B is a graph showing a hysteresis loop.

Referring to FIG. 2A, a memory cell MC may correspond to any one of the memory cells MC of FIG. 1.

The ferroelectric field effect transistor FT may include a material having ferroelectricity. For example, a ferroelectric material may be included in a channel region of the ferroelectric field effect transistor FT.

A gate of the ferroelectric field effect transistor FT may be connected to one of the word lines WL arranged in the row direction of the memory cell array 110. One end of the ferroelectric field effect transistor FT may be connected to one of the bit lines BL arranged in the column direction of the memory cell array 110.

Referring to FIG. 2B, a graph showing a hysteresis loop of the ferroelectric field effect transistor FT is shown. The horizontal axis of the graph represents the magnitude of the gate voltage Vg applied to the ferroelectric field effect transistor FT, and the vertical axis represents the magnitude of the polarization generated in the ferroelectric field effect transistor FT. In FIG. 2B, the gate voltage Vg is 0 V and the point O indicating the initial state is shown at the point where the horizontal and vertical axes of the graph intersect. Here, $P_r$ represents remanent polarization, and in this case, the value stored in the ferroelectric field effect transistor FT may correspond to a first value (e.g., data "1"). $-P_r$ represents remanent polarization in the opposite direction of remanent polarization $P_r$, and in this case, the value stored in the ferroelectric field effect transistor FT may correspond to a second value (e.g., data "0"). Vc represents a coercive voltage. The coercive voltage may correspond to the magnitude of the voltage such that the magnitude of the total polarization of the ferroelectric field effect transistor FT becomes 0.

When the level of the gate voltage Vg applied to the gate of the ferroelectric field effect transistor FT gradually increases from 0 V, polarization occurs in the ferroelectric field effect transistor FT as indicated by the short-long dash line in FIG. 2B, and the magnitude of the polarization of the ferroelectric field effect transistor FT may increase to Ps (point a). In this case, a state of the point a in which the level of the voltage applied to the ferroelectric field effect transistor FT is greater than the level of the first voltage may be referred to as saturation polarization of the ferroelectric field effect transistor FT. Here, a level of the first voltage may be Vmax.

Under saturation polarization, reducing the level of the voltage applied to the ferroelectric field effect transistor FT may reduce the magnitude of the polarization of the ferroelectric field effect transistor FT along the upper solid line without following the dotted line backwards (that is, from point a to point b). At point b shown in FIG. 2B, even though the magnitude of the voltage applied to the gate of the ferroelectric field effect transistor FT is 0 V, the magnitude of the polarization of the ferroelectric field effect transistor FT has a finite value of Pr, not 0, which may be referred to as remanent polarization.

At point b, when a voltage with a negative level (e.g., a reverse voltage) is applied to the gate of the ferroelectric field effect transistor FT and the magnitude of the reverse voltage is gradually increased, polarization in the opposite direction may be generated past point c where the magnitude of the polarization becomes zero and saturated at point d.

At point d, when the magnitude of the reverse voltage applied to the ferroelectric field effect transistor FT is reduced and the magnitude of the forward voltage is increased through the point e, the total charge amount C of the ferroelectric field effect transistor FT may move along a solid line (solid line d-e-f-a) connecting the point d, point e, point f, and point a.

In other words, depending on the level of the voltage applied to one ferroelectric field effect transistor FT, the polarization of the ferroelectric field effect transistor FT may vary along the solid line of the graph shown in FIG. 2B, and a phenomenon in which the value stored in the ferroelectric field effect transistor FT is changed depending on a certain process may be referred to as hysteresis.

Figure 3:
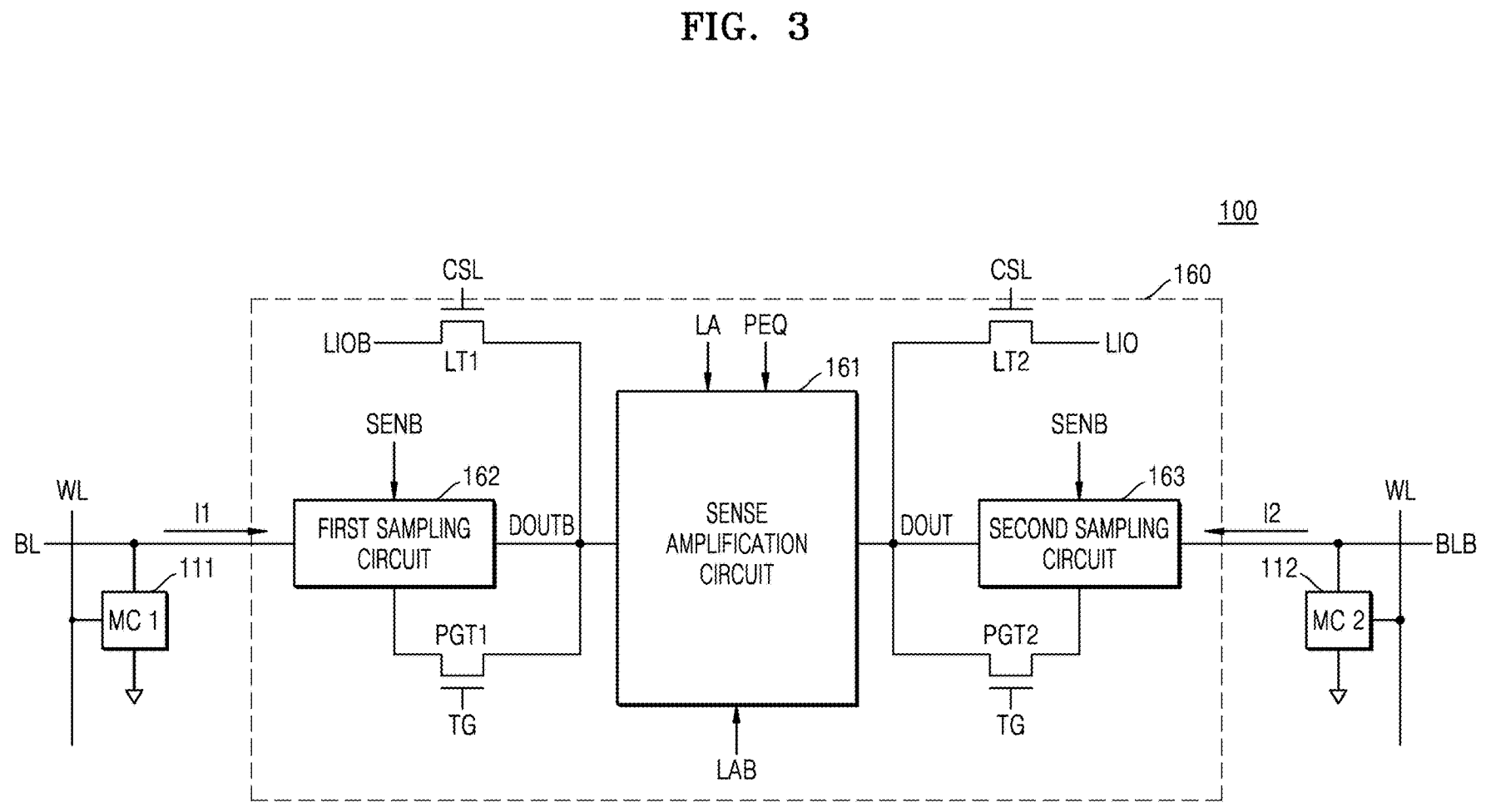

FIG. 3 is a diagram illustrating a sense amplifier and a peripheral configuration of the sense amplifier according to an embodiment. FIG. 3 is described below with reference to FIGS. 1 to 2B, and for convenience of explanation, redundant descriptions may be omitted.

Referring to FIG. 3, a first memory cell 111 and a second memory cell 112 may correspond to the memory cells MC of FIG. 2A. A first word line WL may be coupled to gates of the first memory cell 111 and the second memory cell 112.

A bit line BL may be connected to one end of the first memory cell 111, and a complementary bit line BLB may be connected to one end of the second memory cell 112. A first sampling circuit 162 may be connected to the bit line BL, and a second sampling circuit 163 may be connected to the complementary bit line BLB.

The complementary bit line BLB, the second memory cell 112, and the second sampling circuit 163 may be used as a reference for the sense amplifier 160 to sense a value stored in the first memory cell 111.

The sense amplifier 160 may include a sense amplification circuit 161, the first sampling circuit 162, the second sampling circuit 163, a first precharge transistor PGT1, a second precharge transistor PGT2, a first local input/output transistor LT1, and a second local input/output transistor LT2. The sense amplifier 160 may perform an offset compensation operation, a bit line sampling operation, a charge transfer operation, a sensing operation, and a precharge operation based on a control signal CTRL (see FIG. 1).

In an embodiment, when a first current I1 is greater than a second current I2, the sense amplification circuit 161 may sense that a value stored in the first memory cell 111 is a first value, and when the first current I1 is less than the second current I2, the sense amplification circuit 161 may sense that a value stored in the first memory cell 111 is a second value. A detailed description in this regard is provided below with reference to FIGS. 6A to 7.

The sense amplification circuit 161 may perform an offset compensation operation, a sense operation, and a precharge operation. The sense amplification circuit 161 may generate an offset compensation voltage, which is a voltage corresponding to the voltage difference between the complementary bit line BLB and the bit line BL, through an offset compensation operation. Due to process variation, temperature, etc., mismatches may occur in characteristics between semiconductor devices constituting a sense amplifier, for example, characteristics between devices such as threshold voltages may differ. In the present disclosure, an offset may refer to noise generated by the difference in characteristics between these devices, and an offset compensation operation may refer to compensating for an offset through an offset compensation voltage. In some embodiments, the offset compensation operation may be referred to as an offset cancellation operation. The offset compensation voltage may correspond to a voltage difference between a data output node DOUT and a complementary data output node DOUTB at a time point at which the sampling control signal is applied to the first sampling circuit 162 and the second sampling circuit 163, and a detailed description thereof is provided below with reference to FIGS. 6A to 7. In some embodiments, the complementary data output node DOUTB may be referred to as a first data output node and the data output node DOUT may be referred to as a second data output node. The sense amplification circuit 161 may read a value stored in the first memory cell 111 by sensing the difference in voltage between the data output node DOUT and the complementary data output node DOUTB through the sense operation. In this case, the difference between the voltages of the data output node DOUT and the complementary data output node DOUTB may be the sum of the offset compensation voltage and the sampling voltage. The sampling voltage may correspond to the difference in voltage between the complementary bit line BLB and the bit line BL at a time point at which the sampling control signal is applied to the first sampling circuit 162 and the second sampling circuit 163, and a detailed description thereof is provided below with reference to FIGS. 6A to 7.

The sense amplification circuit 161 may provide the precharge voltage to the bit line BL, the complementary bit line BLB, the data output node DOUT, and the complementary data output node DOUTB through the precharge operation. A detailed description in this regard is provided below with reference to FIGS. 6A to 7.

The first sampling circuit 162 may receive the first current I1 through the bit line BL. The magnitude of the first current I1 may be different depending on a value stored in the first memory cell 111. For example, if the first value is stored in the first memory cell 111, the magnitude of the first current I1 may be 2I, and if the second value is stored in the first memory cell 111, the magnitude of the first current I1 may be I. The second sampling circuit 163 may receive the second current I2 through the complementary bit line BLB. As described above, since the second memory cell 112 is a reference memory cell for sensing a value stored in the first memory cell 111, the second memory cell 112 may provide the second current I2 having a magnitude of 1.5I to the second sampling circuit 163 through the complementary bit line BLB as a reference value to be compared. That is, the magnitude of the second current I2 may be less than the magnitude of the first current I1 when the value stored in the first memory cell 111 is the first value, and may be greater than the magnitude of the first current I1 when the value stored in the first memory cell 111 is the second value. The assumption on the magnitudes of the first current I1 and the second current I2 as described above is illustrative for convenience of explanation, and embodiments are not limited thereto.

The first sampling circuit 162 and the second sampling circuit 163 may perform a sampling operation and a charge transfer operation.

While the first sampling circuit 162 performs a sampling operation, the voltage of the bit line BL may vary. Similarly, while the second sampling circuit 163 performs a sampling operation, the voltage of the complementary bit line BLB may vary. A detailed description of the sampling operation is provided below with reference to FIGS. 6A to 7.

The first sampling circuit 162 may perform a charge transfer operation. In this case, the first sampling circuit 162 may provide the voltage difference of the bit line BL changed during the sampling operation to the complementary data output node DOUTB. Similarly, the second sampling circuit 163 may provide a voltage difference of the complementary bit line BLB changed during the sampling operation to the data output node DOUT through a charge transfer operation. A detailed description of the charge transfer operation is provided below with reference to FIGS. 6A to 7.

The first precharge transistor PGT1 and the second precharge transistor PGT2 may operate in response to a first precharge transistor control signal TG. The first precharge transistor control signal TG may turn on the first precharge transistor PGT1 and the second precharge transistor PGT2 when the memory device 100 performs a write operation on the first memory cell 111. In addition, when the sense amplifier 160 performs the precharge operation, the first precharge transistor control signal TG may turn on the first precharge transistor PGT1 to raise the voltage of the bit line BL to the precharge voltage and may turn on the second precharge transistor PGT2 to raise the voltage of the complementary bit line BLB to the precharge voltage.

One end of the first precharge transistor PGT1 may be connected to the complementary data output node DOUTB, and the other end of the first precharge transistor PGT1 may be connected to the first sampling circuit 162. One end of the second precharge transistor PGT2 may be connected to the data output node DOUT, and the other end of the second precharge transistor PGT2 may be connected to the second sampling circuit 163.

The first local input/output transistor LT1 and the second local input/output transistor LT2 may operate in response to the column selection signal CSL. When the memory device 100 outputs data to the outside of the memory device 100 or data is written to the memory device 100, the first local input/output transistor LT1 and the second local input/output transistor LT2 may be turned on through the column selection signal CSL.

One end of the first local input/output transistor LT1 may be connected to the complementary data output node DOUTB, and the other end of the first local input/output transistor LT1 may be connected to a complementary local input/output signal terminal LIOB. One end of the second local input/output transistor LT2 may be connected to the data output node DOUT, and the other end of the second local input/output transistor LT2 may be connected to a local input/output signal terminal LIO.

Figure 4:
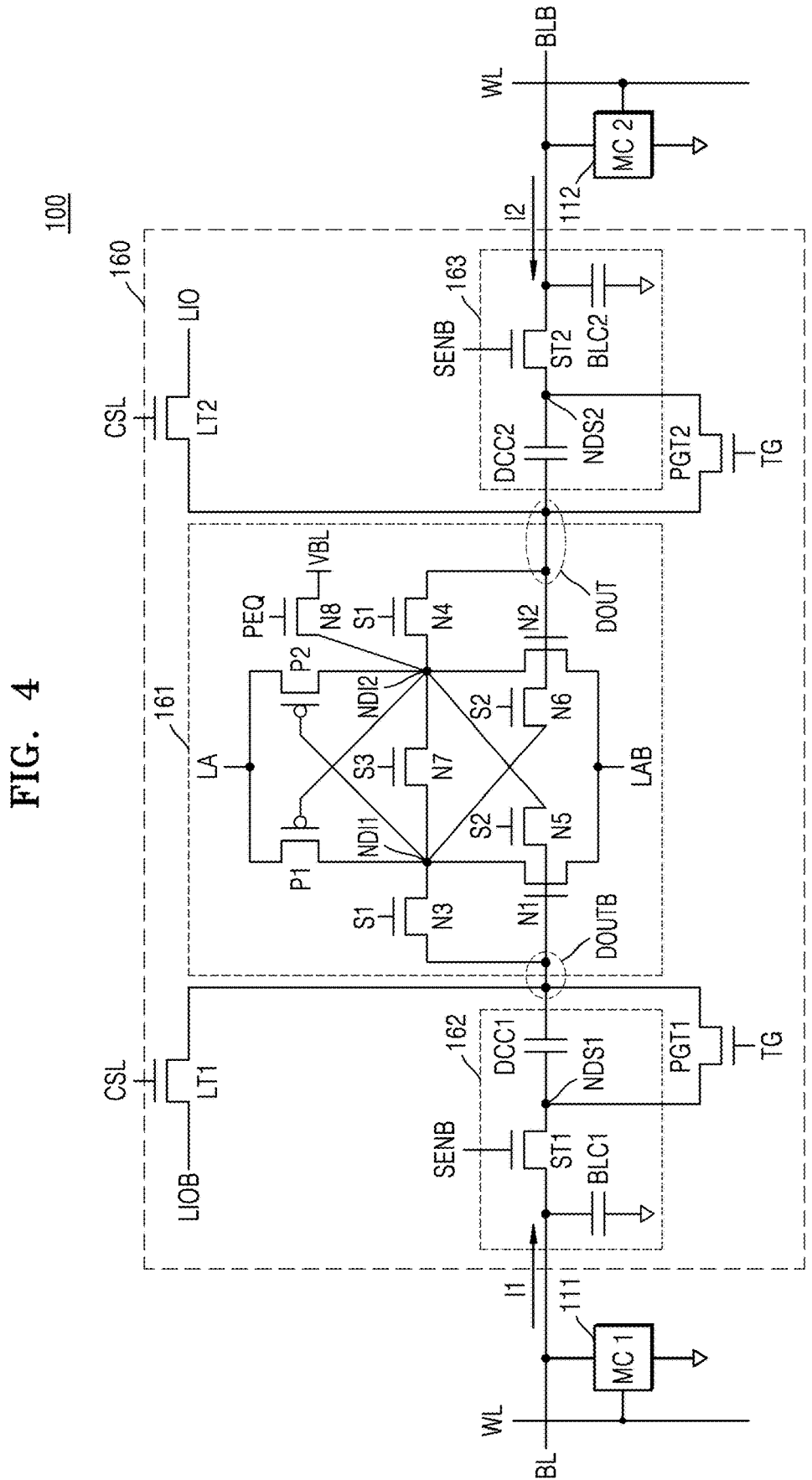
FIG. 4 is a circuit diagram illustrating a sense amplifier and a peripheral configuration of the sense amplifier according to an embodiment.

FIG. 4 is a circuit diagram illustrating a sense amplifier and a peripheral configuration of the sense amplifier according to an embodiment. For example, FIG. 4 is a circuit diagram showing the sense amplifier shown in FIG. 3 in detail. FIG. 4 is described below with reference to FIGS. 1 to 3, and for convenience of explanation, redundant descriptions may be omitted.

The sense amplification circuit 161 may be connected to a sense driving signal end LA and a complementary sense driving signal end LAB. The sense amplification circuit 161 may include a first PMOS transistor P1, a second PMOS transistor P2, a first NMOS transistor N1, a second NMOS transistor N2, a third NMOS transistor N3, a fourth NMOS transistor N4, a fifth NMOS transistor N5, a sixth NMOS transistor N6, a seventh NMOS transistor N7, and an eighth NMOS transistor N8.

In an embodiment, the control signal CTRL of FIG. 1 may include a precharge equalizing signal PEQ, a sampling control signal SENB, a first precharge transistor control signal TG, a column selection signal CSL, a first sense signal S1, a second sense signal S2, and a third sense signal S3.

One end of the first PMOS transistor P1 may be connected to the sense driving signal end LA. The other end of the first PMOS transistor P1 may be connected to a first internal node NDI1. The gate of the first PMOS transistor P1 may be connected to a second internal node NDI2.

One end of the second PMOS transistor P2 may be connected to the sense driving signal end LA. The other end of the second PMOS transistor P2 may be connected to the second internal node NDI2. The gate of the second PMOS transistor P2 may be connected to the first internal node NDI1.

One end of the first NMOS transistor N1 may be connected to the first internal node NDI1. The other end of the first NMOS transistor N1 may be connected to the complementary sense driving signal end LAB. The gate of the first NMOS transistor N1 may be connected to the complementary data output node DOUTB.

One end of the second NMOS transistor N2 may be connected to the second internal node NDI2. The other end of the second NMOS transistor N2 may be connected to the complementary sense driving signal end LAB. The gate of the second NMOS transistor N2 may be connected to the data output node DOUT.

One end of the third NMOS transistor N3 may be connected to the first internal node NDI1. The other end of the third NMOS transistor N3 may be connected to the complementary data output node DOUTB. One end of the fourth NMOS transistor N4 may be connected to the second internal node NDI2. The other end of the fourth NMOS transistor N4 may be connected to the data output node DOUT. The third NMOS transistor N3 and the fourth NMOS transistor N4 may be turned on in response to the first sense signal S1.

One end of the fifth NMOS transistor N5 may be connected to the complementary data output node DOUTB. The other end of the fifth NMOS transistor N5 may be connected to the second internal node NDI2. One end of the sixth NMOS transistor N6 may be connected to the data output node DOUT. The other end of the sixth NMOS transistor N6 may be connected to the first internal node NDI1. The fifth NMOS transistor N5 and the sixth NMOS transistor N6 may be turned on in response to the second sense signal S2.

One end of the seventh NMOS transistor N7 may be connected to the first internal node NDI1. The other end of the seventh NMOS transistor N7 may be connected to the second internal node NDI2. The seventh NMOS transistor N7 may be turned on in response to the third sense signal S3.

One end of the eighth NMOS transistor N8 may be connected to the second internal node NDI2. A precharge voltage VBL may be applied to the other end of the eighth NMOS transistor N8. The eighth NMOS transistor N8 may be turned on in response to the precharge equalizing signal PEQ. In some embodiments, the eighth NMOS transistor N8 may be referred to as a first precharge equalizing transistor.

The first sampling circuit 162 may include a first decoupling capacitor DCC1, a first sampling transistor ST1, and a first bit line capacitor BLC1.

The first decoupling capacitor DCC1 may be connected between a first sampling node NDS1 and the complementary data output node DOUTB.

One end of the first sampling transistor ST1 may be connected to the bit line BL. The other end of the first sampling transistor ST1 may be connected to the first sampling node NDS1. The first sampling transistor ST1 may be turned on in response to the sampling control signal SENB. One end of the first bit line capacitor BLC1 may be connected to the bit line BL. The capacitance of the first bit line capacitor BLC1 may correspond to a parasitic capacitance present in the bit line BL.

The second sampling circuit 163 may include a second decoupling capacitor DCC2, a second sampling transistor ST2, and a second bit line capacitor BLC2.

The second decoupling capacitor DCC2 may be connected between a second sampling node NDS2 and the data output node DOUT.

One end of the second sampling transistor ST2 may be connected to the complementary bit line BLB. The other end of the second sampling transistor ST2 may be connected to the second sampling node NDS2. The second sampling transistor ST2 may be turned on in response to the sampling control signal SENB.

One end of the second bit line capacitor BLC2 may be connected to the complementary bit line BLB. The capacitance of the second bit line capacitor BLC2 may correspond to a parasitic capacitance present in the complementary bit line BLB.

In an embodiment, when the memory device 100 performs a write operation on the first memory cell 111, the first precharge equalizing transistor N8 may be turned off, and the first precharge transistor PGT1 and the second precharge transistor PGT2 may be turned on in response to the first precharge transistor control signal TG. The first sampling transistor ST1 and the second sampling transistor ST2 may be turned on in response to the sampling control signal SENB. The first local input/output transistor LT1 and the second local input/output transistor LT2 may be turned on in response to the column selection signal CSL. The sense driving signal end LA and the complementary sense driving signal end LAB may be in a floating state, and in this case, voltages of the sense driving signal end LA and the complementary sense driving signal end LAB may be the precharge voltage VBL.

The operation of reading data stored in the first memory cell 111 by the memory device 100 is described below with reference to FIGS. 6A to 7.

Figure 5:
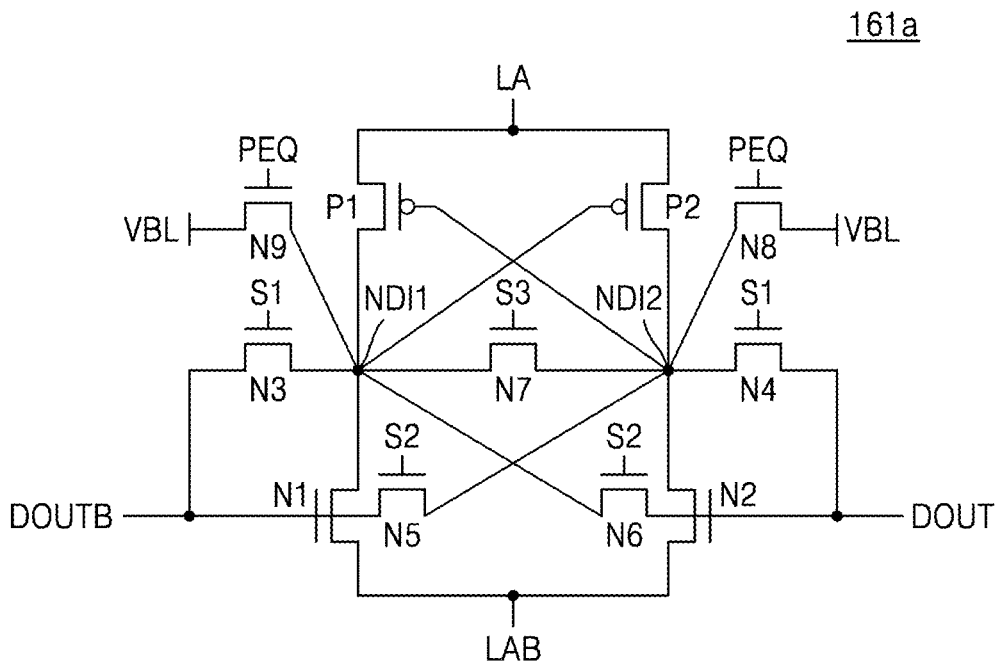
FIG. 5 is a circuit diagram illustrating a sense amplification circuit according to an embodiment.

FIG. 5 is a circuit diagram illustrating a sense amplification circuit according to an embodiment. For example, a sense amplification circuit 161a of FIG. 5 may be an example of the sense amplification circuit 161 of FIG. 4. FIG. 5 is described below with a focus on the differences from the sense amplification circuit 161 of FIG. 4, and for convenience of explanation, redundant descriptions may be omitted.

Referring to FIG. 5, the sense amplification circuit 161a may include a first PMOS transistor P1, a second PMOS transistor P2, a first NMOS transistor N1, a second NMOS transistor N2, a third NMOS transistor N3, a fourth NMOS transistor N4, a fifth NMOS transistor N5, a sixth NMOS transistor N6, a seventh NMOS transistor N7, an eighth NMOS transistor N8, and a ninth NMOS transistor N9. That is, the sense amplification circuit 161a of FIG. 5 may be a circuit that further includes the ninth NMOS transistor N9 in addition to the sense amplification circuit 161 of FIG. 4.

One end of the ninth NMOS transistor N9 may be connected to the first internal node NDI1. The precharge voltage VBL may be applied to the other end of the ninth NMOS transistor N9. The ninth NMOS transistor N9 may be turned on in response to the precharge equalizing signal PEQ. In some embodiments, the ninth NMOS transistor N9 may be referred to as a second precharge equalizing transistor.

The sense amplification circuit 161a of FIG. 5 may have a symmetrical structure unlike the sense amplification circuit 161 of FIG. 4. Accordingly, the sense amplifier 160 including the sense amplification circuit 161a of FIG. 5 may be referred to as having a symmetrical structure, and the sense amplifier 160 including the sense amplification circuit 161 of FIG. 4 may be referred to as having an asymmetric structure. When the sense amplification circuit 161a is symmetrically designed as shown in FIG. 5, mismatches occurring between semiconductor devices constituting the sense amplification circuit 161a may be reduced.

Figure 6A:
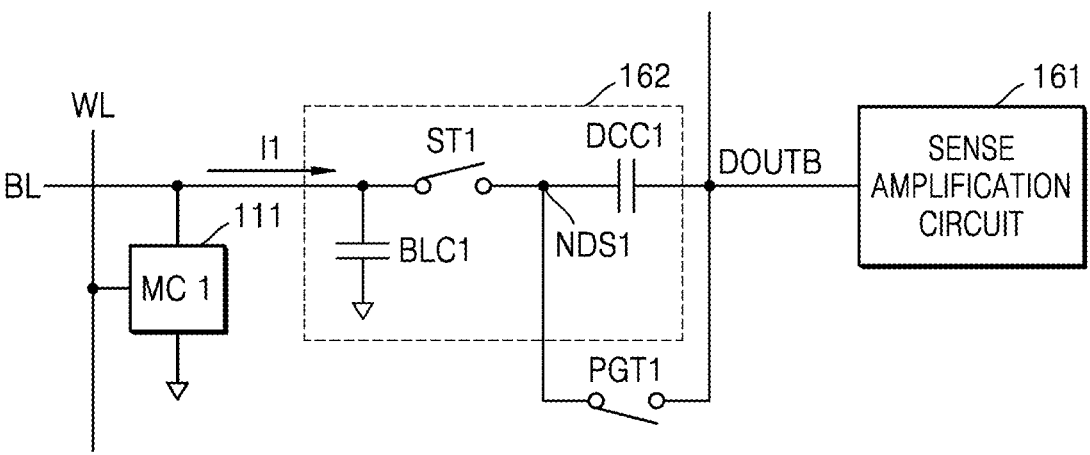
FIGS. 6A, 6B, and 6C are diagrams illustrating an operation of the sense amplifier according to an embodiment.
Figure 6B:
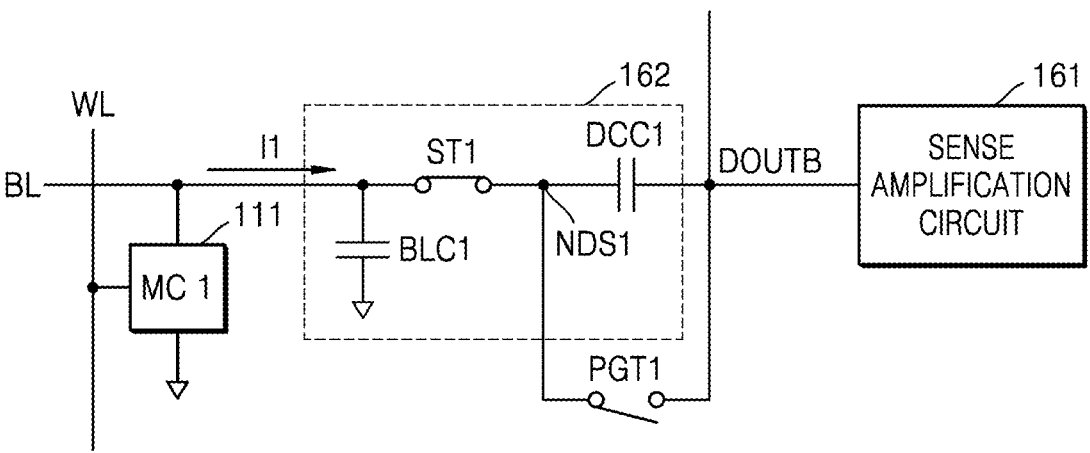
Figure 6C:
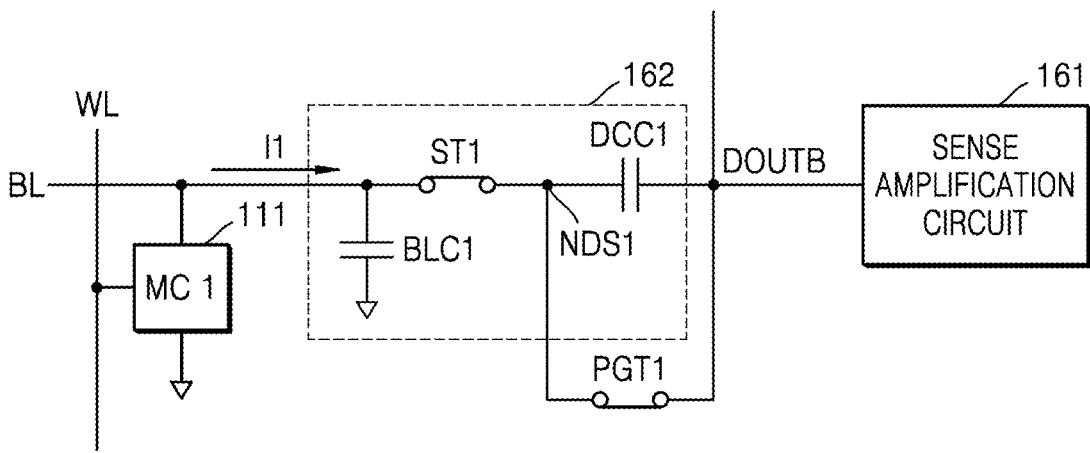

FIGS. 6A, 6B, and 6C are diagrams illustrating an operation of the sense amplifier according to an embodiment. FIG. 7 is a timing diagram illustrating signals applied to a sense amplifier when data stored in a memory cell is sensed through the sense amplifier according to an embodiment. FIGS. 6A to 7 are described below with reference to FIGS. 1 to 5, and for convenience of explanation, redundant descriptions may be omitted.

Figure 7:
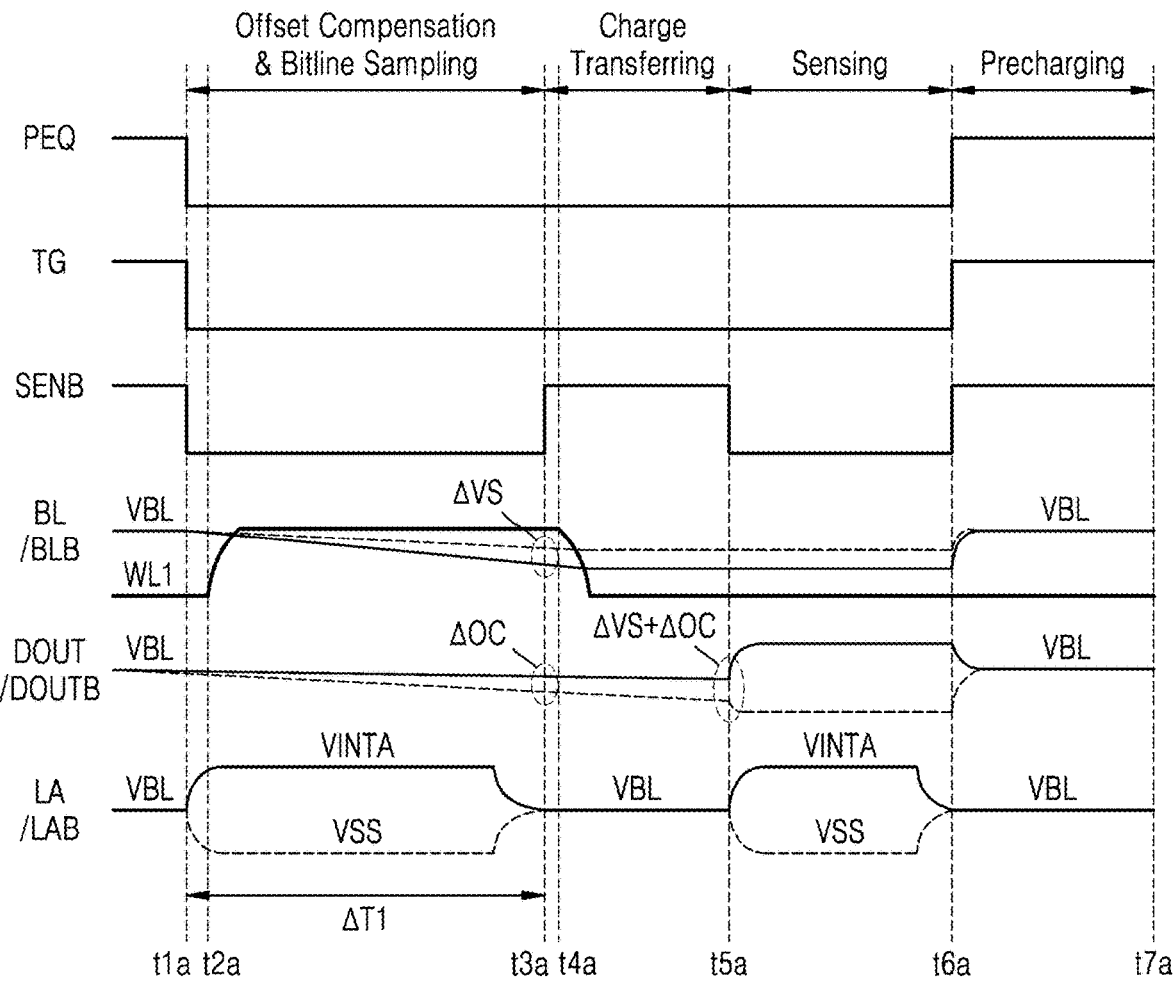
FIG. 7 is a timing diagram illustrating signals applied to a sense amplifier when data stored in a memory cell is sensed through the sense amplifier according to an embodiment.

In FIGS. 6A to 7, the sense amplifier 160 of FIG. 4 is described as an example. In this case, it is assumed that the first value is stored in the first memory cell 111. It is also assumed that the size of the first current I1 is 2I, and the magnitude of the second current I2 output from the second memory cell 112 is 1.5I. In addition, in FIGS. 6A to 6C, the first sampling circuit 162 is mainly described, and since the second sampling circuit 163 has the same configuration as the first sampling circuit 162, the former may operate in the same manner as the latter. In FIG. 7, the graph corresponding to the voltage of the bit line BL is shown as a solid line, and the graph corresponding to the voltage of the complementary bit line BLB is shown as a dotted line. In addition, the graph corresponding to the complementary data output node DOUTB is shown as a dotted line, and the graph corresponding to the data output node DOUT is shown as a solid line. In addition, the graph corresponding to the voltage at the sense driving signal LA is shown as a solid line, and the graph corresponding to the voltage at the complementary sense driving signal LAB is shown as a dotted line.

FIG. 6A is a diagram illustrating an offset compensation operation and a bit line sampling operation when the sense amplifier 160 reads data stored in the first memory cell 111. Referring to FIGS. 6A and 7, the sense amplifier 160 may perform an offset compensation operation and a bit line sampling operation from a first time point t1a to a third time point t3a. The offset compensation operation may be performed through the sense amplification circuit 161, and the bit line sampling operation may be performed through the first sampling circuit 162 and the second sampling circuit 163. Hereinafter, a time section from the first time point t1a to the third time point t3a may be defined as a first time section ΔT1.

In an embodiment, voltages of the bit line BL and the complementary bit line BLB may be a precharge voltage VBL before the first time point t1a. Also, the voltage at the first sampling node NDS1 may be the precharge voltage VBL. The sense driving signal end LA and the complementary sense driving signal end LAB may be in a floating state, and in this case, voltages of the sense driving signal end LA and the complementary sense driving signal end LAB may be the precharge voltage VBL.

At the first time point t1a, the first precharge equalizing transistor N8 may be turned off in response to the precharge equalizing signal PEQ. The first precharge transistor PGT1 may be turned off in response to the first precharge transistor control signal TG. The first sampling transistor ST1 may be turned off in response to the sampling control signal SENB. At a second time point t2a, the word line WL may be turned on.

At the first time point t1a, the first current I1 may flow to the first bit line capacitor BLC1 along the bit line BL, and accordingly, the voltage of the bit line BL may decrease as shown in the graph by the solid line of FIG. 7 before reaching the third time point t3a. At the first time point t1a, the second current I2 may flow to the second bit line capacitor BLC2 along the complementary bit line BLB, and accordingly, the voltage of the complementary bit line BLB may decrease as shown in the graph by the dotted line of FIG. 7 before reaching the third time point t3a. In this case, since the magnitude of the first current I1 is greater than the magnitude of the second current I2, the magnitude of the slope of the graph corresponding to the voltage change of the bit line BL during the first time section ΔT1 may be greater than the magnitude of the slope of the graph corresponding to the voltage change of the complementary bit line BLB (e.g., the former may be steeper than the latter.).

In an embodiment, when the magnitude of the first current I1 is less than the magnitude of the second current I2, the magnitude of the slope of the graph corresponding to the voltage change of the bit line BL during the first time section ΔT1 may be less than the magnitude of the slope of the graph corresponding to the voltage change of the complementary bit line BLB (e.g., the former may be gentler than the latter).

At the first time point t1a, an internal power voltage VINTA may be applied to the sense driving signal end LA, and the ground voltage VSS may be applied to the complementary sense driving signal end LAB.

FIG. 6B is a diagram for explaining a charge transfer operation and a sense operation when the sense amplifier 160 reads data stored in the first memory cell 111. Referring to FIGS. 6B and 7, the sense amplifier 160 may perform a charge transfer operation from the third time point t3a to a fifth time point t5a. The sense amplifier 160 may perform sense operations from the fifth time point t5a to a sixth time point t6a.

At the third time point t3a, the logic level of the sampling control signal SENB may transition from a low level to a high level. That is, the third time point t3a may refer to a time point at which the sampling control signal SENB is in a rising edge.

At the third time point t3a, the first sampling transistor ST1 may be turned on in response to the sampling control signal SENB. As the first sampling transistor ST1 is turned on, a voltage at the first sampling node NDS1 may coincide with that of the bit line BL. In addition, in this case, since no external power source is connected to the first decoupling capacitor DCC1, the voltage difference between both ends of the first decoupling capacitor DCC1 should be maintained. Accordingly, as the voltage at the first sampling node NDS1 is changed as the first sampling transistor ST1 is turned on, the voltage at the complementary data output node DOUTB may also be changed.

At the third time point t3a, a difference between voltages of the complementary bit line BLB and the bit line BL may correspond to a sampling voltage AVS. In addition, at the third time point t3a, the difference between the voltages at the data output node DOUT and the complementary data output node DOUTB may correspond to an offset compensation voltage $\Delta OC$. From the third time point t3a to the fifth time point t5a, the sense driving signal end LA and the complementary sense driving signal end LAB may be in a floating state, and in this case, the voltages of the sense driving signal end LA and the complementary sense driving signal end LAB may be the precharge voltage VBL.

At a fourth time point t4a, the word line WL may be turned off. At the fifth time point t5a, the logic level of the sampling control signal SENB may transition from a high level to a low level. That is, the fifth time point t5a may refer to a time point at which the sampling control signal SENB is in a falling edge.

At the fifth time point t5a, the difference between the voltages at the data output node DOUT and the complementary data output node DOUTB may correspond to a voltage obtained by adding the offset compensation voltage $\Delta OC$ to the sampling voltage AVS. The sense amplification circuit 161 may perform a sense operation based on the difference between the voltages at the data output node DOUT and the complementary data output node DOUTB at the fifth time point t5a. In this case, the voltage at the data output node DOUT from the fifth time point t5a to a sixth time point t6a may be higher than the precharge voltage VBL, and the voltage at the complementary data output node DOUTB may be lower than the precharge voltage VBL. From the fifth time point t5a to the sixth time point t6a, the first sampling transistor ST1 may be turned off in response to the sampling control signal SENB. In this case, a circuit diagram of the sense amplifier 160 may be as illustrated in FIG. 6A. That is, when the sense amplifier 160 performs a sense operation, the first bit line capacitor BLC1 may be electrically separated from the sense amplifier 160. This is due to a hysteresis phenomenon of the transistor constituting the first memory cell 111, and the sense amplifier 160 according to an embodiment may not utilize a restore operation to read data of the first memory cell 111. Accordingly, the time taken to read data stored in the first memory cell 111 may be reduced.

At the fifth time point t5a, the internal power voltage VINTA may be applied to the sense driving signal end LA, and the ground voltage VSS may be applied to the complementary sense driving signal end LAB.

FIG. 6C is a diagram illustrating a precharge operation of the sense amplifier 160. Referring to FIGS. 6C and 7, the sense amplifier 160 may perform a precharge operation from the sixth time point t6a to a seventh time point t7a.

At the sixth time point t6a, the first precharge equalizing transistor N8 may be turned on in response to the precharge equalizing signal PEQ. The first precharge transistor PGT1 may be turned on in response to the first precharge transistor control signal TG. The first sampling transistor ST1 may be turned on in response to the sampling control signal SENB.

From the sixth time point t6a to the seventh time point t7a, the sense driving signal end LA and the complementary sense driving signal end LAB may be in a floating state, and in this case, the voltages of the sense driving signal end LA and the complementary sense driving signal end LAB may be the precharge voltage VBL.

From the sixth time point t6a to the seventh time point t7a, voltages of the bit line BL and the complementary bit line BLB may be the precharge voltage VBL. In addition, voltages at the data output node DOUT and the complementary data output node DOUTB may be the precharge voltage VBL.

Figure 8:
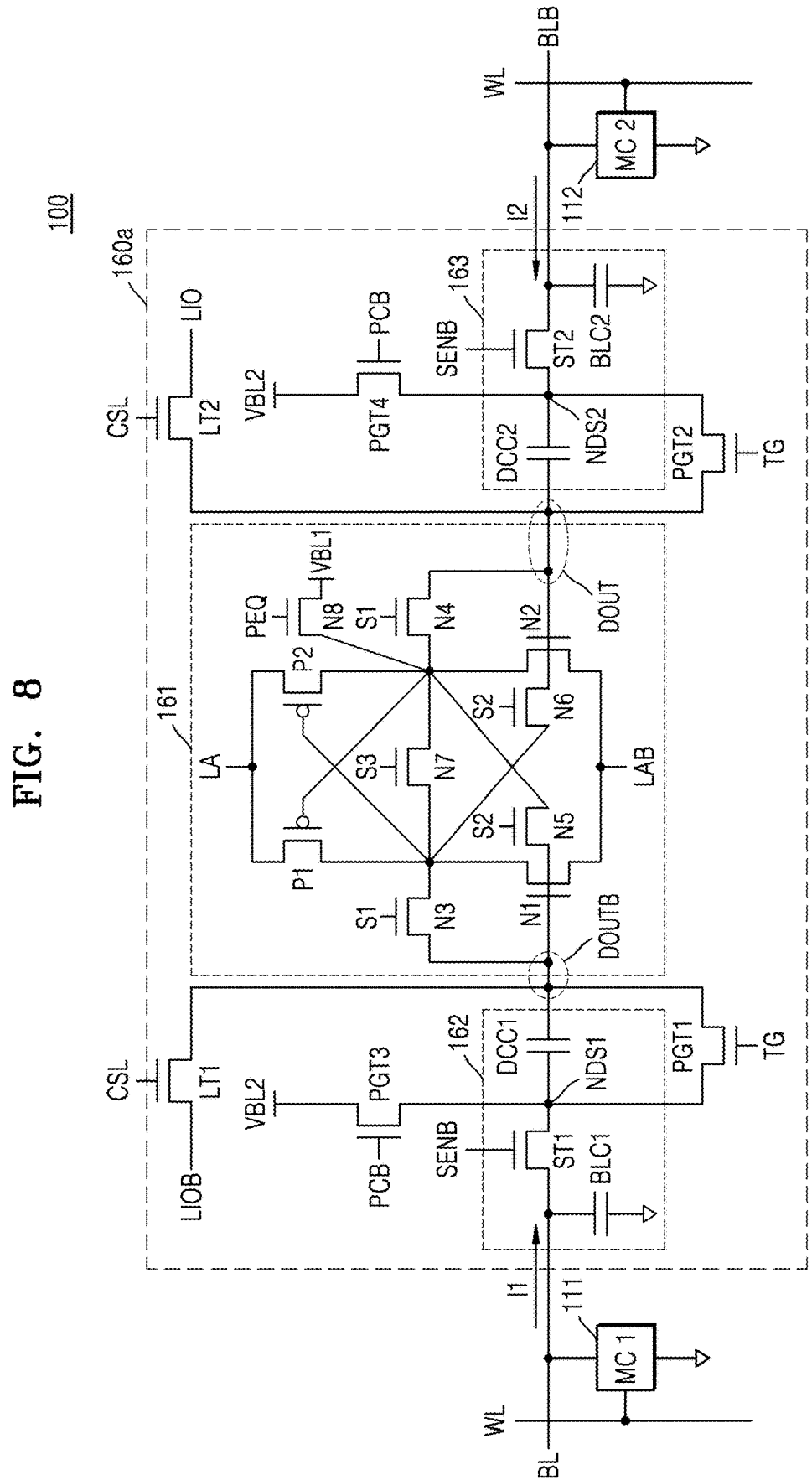
FIG. 8 is a circuit diagram illustrating a sense amplifier and a peripheral configuration of the sense amplifier according to an embodiment.

FIG. 8 is a circuit diagram illustrating a sense amplifier and a peripheral configuration of the sense amplifier according to an embodiment. For example, FIG. 8 is a circuit diagram showing the sense amplifier shown in FIG. 3 in detail. FIG. 8 is described below with reference to FIGS. 1 to 3, and for convenience of explanation, redundant descriptions may be omitted. Hereinafter, the differences from FIG. 4 are mainly described.

A sense amplifier 160a may include a sense amplification circuit 161, a first sampling circuit 162, a second sampling circuit 163, a first precharge transistor PGT1, a second precharge transistor PGT2, a third precharge transistor PGT3, a fourth precharge transistor PGT4, a first local input/output transistor LT1, and a second local input/output transistor LT2.

In embodiments, the control signal CTRL of FIG. 1 may include a precharge equalizing signal PEQ, a sampling control signal SENB, a first precharge transistor control signal TG, a second precharge transistor control signal PCB, a column selection signal CSL, a first sense signal S1, a second sense signal S2, and a third sense signal S3 of FIG. 8.

One end of an eighth NMOS transistor N8 may be connected to a second internal node NDI2 in the sense amplifier 160a. A first precharge voltage VBL1 may be applied to the other end of the eighth NMOS transistor N8. The eighth NMOS transistor N8 may be turned on in response to the precharge equalizing signal PEQ. In some embodiments, the eighth NMOS transistor N8 may be referred to as a first precharge equalizing transistor.

The third precharge transistor PGT3 and the fourth precharge transistor PGT4 may operate in response to the second precharge transistor control signal PCB.

The second precharge transistor control signal PCB may be provided to the gate of the third precharge transistor PGT3. One end of the third precharge transistor PGT3 may be connected to the first sampling node NDS1. The second precharge voltage VBL2 may be applied to the other end of the third precharge transistor PGT3.

The second precharge transistor control signal PCB may be provided to the gate of the fourth precharge transistor PGT4. One end of the fourth precharge transistor PGT4 may be connected to the second sampling node NDS2. The second precharge voltage VBL2 may be applied to the other end of the fourth precharge transistor PGT4.

In embodiments, the second precharge voltage VBL2 may be greater than the first precharge voltage VBL1.

In an embodiment, the sense amplifier 160a of FIG. 8 may include the sense amplification circuit 161a of FIG. 5 instead of the sense amplification circuit 161 of FIG. 8.

Figure 9A:
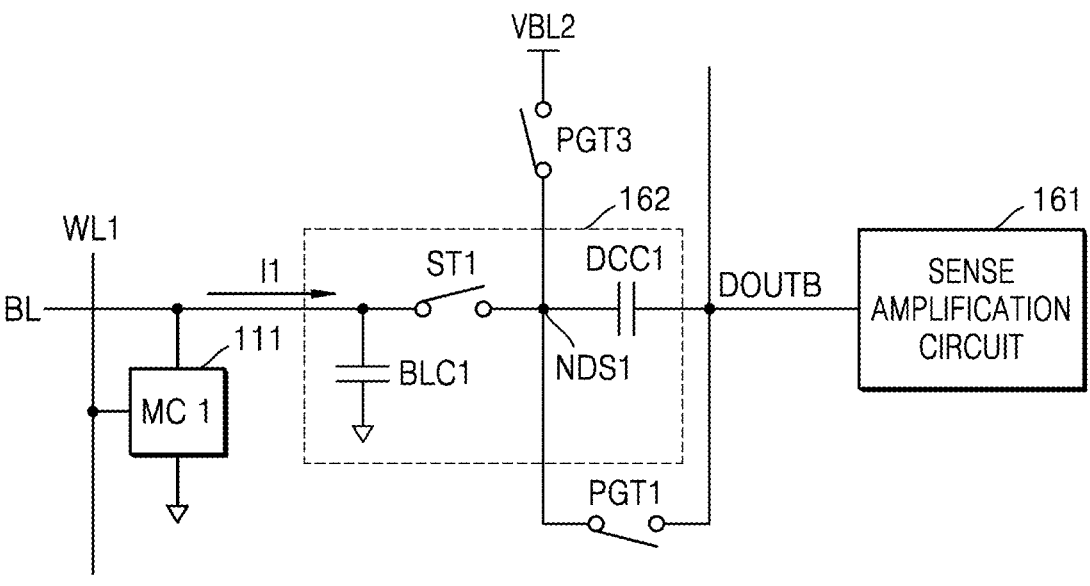
FIGS. 9A, 9B, and 9C are diagrams illustrating an operation of the sense amplifier according to an embodiment.
Figure 9B:
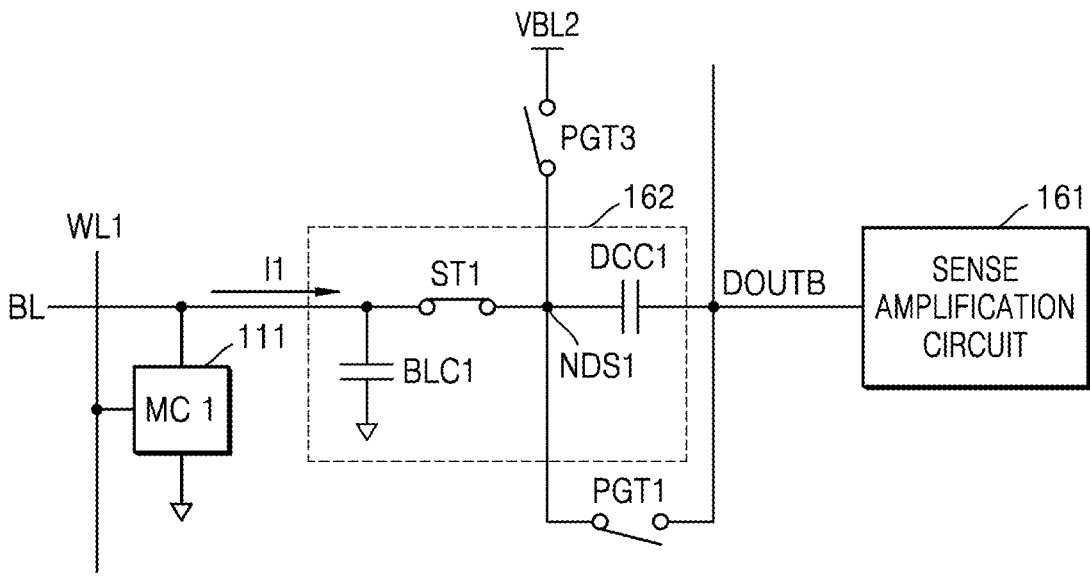
Figure 9C:
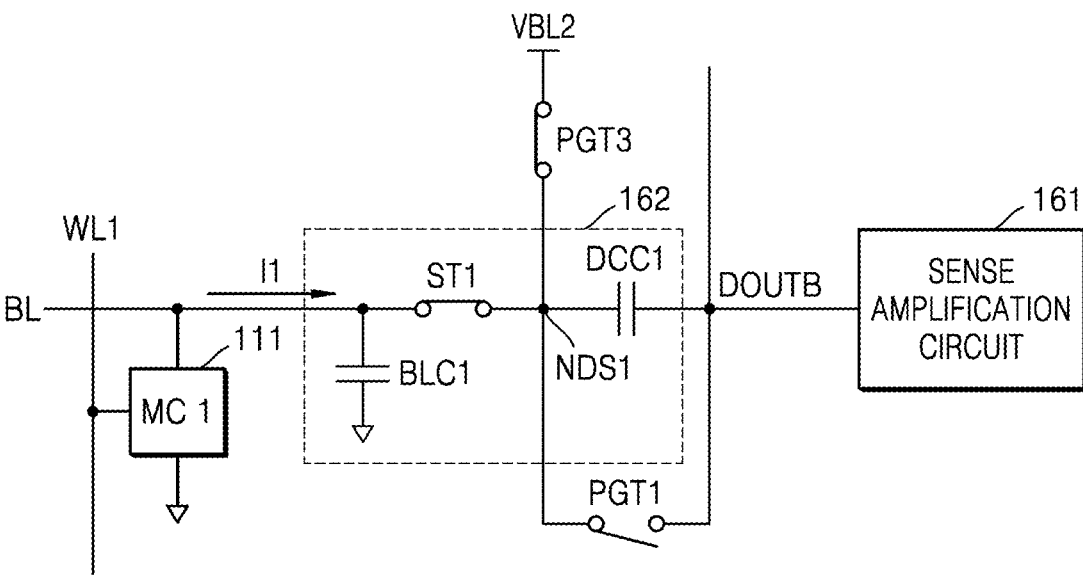
Figure 10:
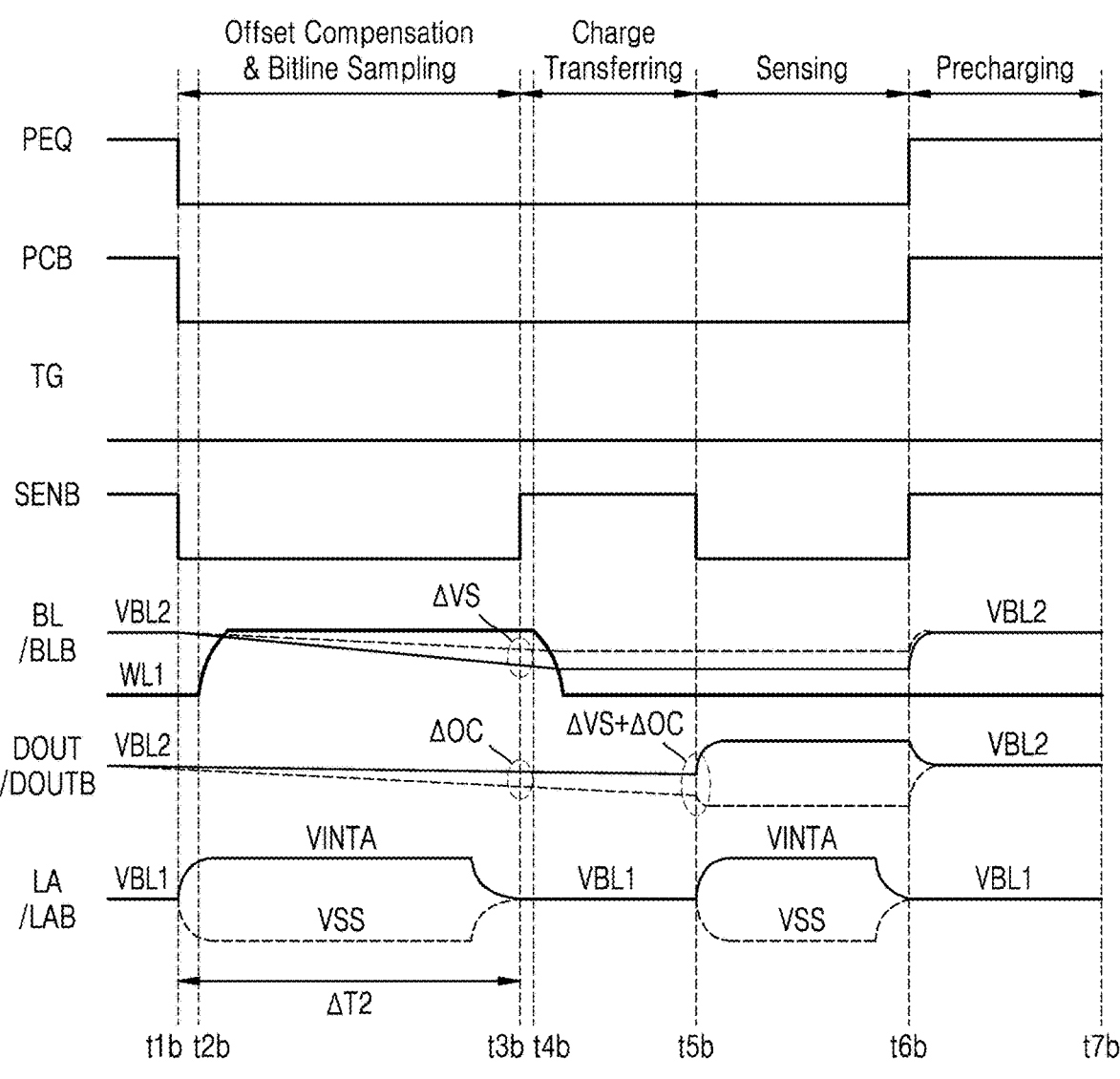
FIG. 10 is a timing diagram illustrating signals applied to a sense amplifier when data stored in a memory cell is sensed through the sense amplifier according to an embodiment.

FIGS. 9A, 9B, and 9C are diagrams illustrating an operation of the sense amplifier according to an embodiment. FIG. 10 is a timing diagram illustrating signals applied to a sense amplifier when data stored in a memory cell is sensed through the sense amplifier according to an embodiment. FIGS. 9A to 10 are described below with reference to FIGS. 1 to 8, and for convenience of explanation, redundant descriptions may be omitted. Hereinafter, the differences from FIGS. 6A to 7 are mainly described.

In FIGS. 9A to 10, the sense amplifier 160a of FIG. 8 is described as an example. In this case, it is assumed that the first value is stored in the first memory cell 111. It is also assumed that the size of the first current I1 is 2I, and the magnitude of the second current I2 output from the second memory cell 112 is 1.5I. In addition, in FIGS. 9A to 9C, the first sampling circuit 162 is mainly described, and since the second sampling circuit 163 has the same configuration as the first sampling circuit 162, the former may operate in the same manner as the latter. In FIG. 10, the graph corresponding to the voltage of the bit line BL is shown as a solid line, and the graph corresponding to the voltage of the complementary bit line BLB is shown as a dotted line. In addition, the graph corresponding to the complementary data output node DOUTB is shown as a dotted line, and the graph corresponding to the data output node DOUT is shown as a solid line. In addition, the graph corresponding to the voltage at the sense driving signal LA is shown as a solid line, and the graph corresponding to the voltage at the complementary sense driving signal LAB is shown as a dotted line.

FIG. 9A is a diagram illustrating an offset compensation operation and a bit line sampling operation when the sense amplifier 160a reads data stored in the first memory cell 111. Referring to FIGS. 9A and 10, the sense amplifier 160a may perform an offset compensation operation and a bit line sampling operation from a first time point t1b to a third time point t3b. Hereinafter, a time section from the first time point t1b to the third time point t3b may be defined as a second time section ΔT2.

In an embodiment, voltages of the bit line BL and the complementary bit line BLB may be a second precharge voltage VBL2 before the first time point t1b. Also, the voltage at the first sampling node NDS1 may be the second precharge voltage VBL2. The sense driving signal end LA and the complementary sense driving signal end LAB may be in a floating state, and in this case, voltages of the sense driving signal end LA and the complementary sense driving signal end LAB may be a first precharge voltage VBL1.

In an embodiment, when the voltages of the bit line BL and the complementary bit line BLB are the second precharge voltage VBL2, the offset compensation operation and the bit line sampling operation may be performed faster than when the voltages of the bit line BL and the complementary bit line BLB are the first precharge voltage VBL1. That is, the second time section ΔT2 of FIG. 10 may be a time section shorter than the first time section ΔT1 of FIG. 7.

At the first time point t1b, the first current I1 may flow to the first bit line capacitor BLC1 along the bit line BL, and accordingly, the voltage of the bit line BL may decrease as shown in the graph shown by the solid line of FIG. 10 before reaching the third time point t3b. At the first time point t1b, the second current I2 may flow to the second bit line capacitor BLC2 along the complementary bit line BLB, and accordingly, the voltage of the complementary bit line BLB may decrease as shown in the graph shown by the dotted line of FIG. 10 before reaching the third time point t3b. In this case, since the magnitude of the first current I1 is greater than the magnitude of the second current I2, the magnitude of the slope of the graph corresponding to the voltage change of the bit line BL during the second time section ΔT2 may be greater than the magnitude of the slope of the graph corresponding to the voltage change of the complementary bit line BLB (e.g., the former may be steeper than the latter.).

In an embodiment, the magnitude of the slope of the graph corresponding to the voltage change of the bit line BL during the second time period ΔT2 of FIG. 10 may be greater than the magnitude of the slope of the graph corresponding to the voltage change of the bit line BL during the first time period ΔT1 of FIG. 7 (e.g., the former may be steeper than the latter.). In an embodiment, when the magnitude of the first current I1 is less than the magnitude of the second current I2, the magnitude of the slope of the graph corresponding to the voltage change of the bit line BL during the second time section ΔT2 may be less than the magnitude of the slope of the graph corresponding to the voltage change of the complementary bit line BLB (e.g., the former may be gentler than the latter).

FIG. 9B is a diagram for explaining a charge transfer operation and a sense operation when the sense amplifier 160 reads data stored in the first memory cell 111. Referring to FIGS. 9B and 10, the sense amplifier 160a may perform a charge transfer operation from the third time point t3b to a fifth time point t5b. The sense amplifier 160a may perform sense operations from the fifth time point t5b to a sixth time point t6b. In this case, the voltage at the data output node DOUT from the fifth time point t5b to a sixth time point t6b may be higher than the second precharge voltage VBL2, and the voltage at the complementary data output node DOUTB may be lower than the second precharge voltage VBL2.

FIG. 9C is a diagram illustrating a precharge operation of the sense amplifier 160a. Referring to FIGS. 9C and 10, the sense amplifier 160a may perform a precharge operation from the sixth time point t6b to a seventh time point t7b.

At the sixth time point t6b, the third precharge transistor PGT3 may be turned on in response to the second precharge transistor control signal PCB. In this case, the first precharge transistor PGT1 may still be in the turned-off state. That is, in the case of the sense amplifier 160a of FIG. 8, unless the memory device 100 performs a write operation, the first precharge transistor control signal TG may always have a logic level to turn off the first precharge transistor PGT1.

From the sixth time point t6b to the seventh time point t7b, the sense driving signal end LA and the complementary sense driving signal end LAB may be in a floating state, and in this case, the voltages of the sense driving signal end LA and the complementary sense driving signal end LAB may be the first precharge voltage VBL1.

From the sixth time point t6b to the seventh time point t7b, voltages of the bit line BL and the complementary bit line BLB may be the second precharge voltage VBL2. In addition, voltages at the data output node DOUT and the complementary data output node DOUTB may be the second precharge voltage VBL2.

Figure 11:
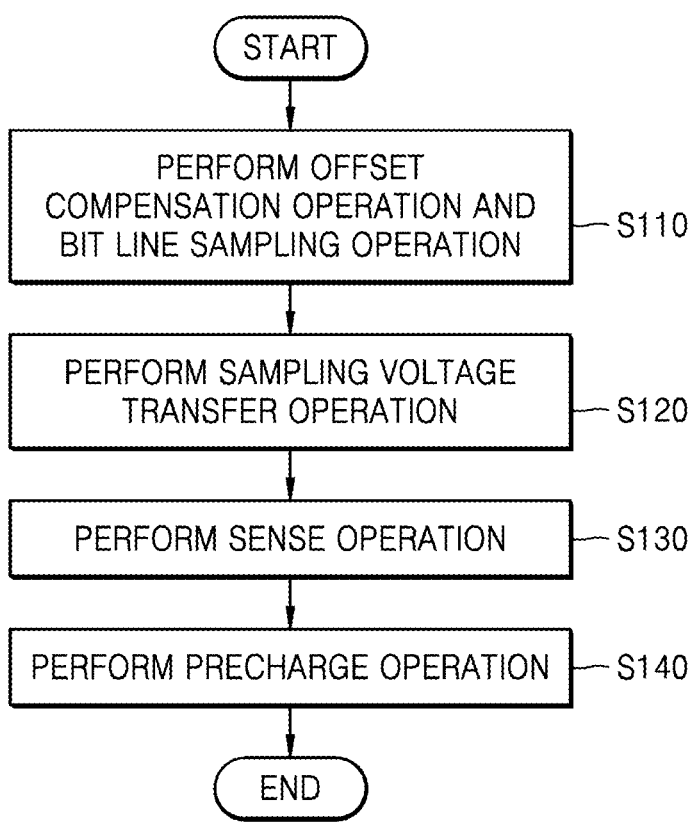
FIG. 11 is a flowchart illustrating a method of operating a sense amplifier according to an embodiment.

FIG. 11 is a flowchart illustrating a method of operating a sense amplifier according to an embodiment. FIG. 11 is described below with reference to FIGS. 1 to 7, and for convenience of explanation, redundant descriptions may be omitted.

In operation S110, the sense amplifier 160 may perform an offset compensation operation and a bit line sampling operation. For example, the sense amplifier 160 may generate an offset compensation voltage based on the difference between voltages at the data output node DOUT and the complementary data output node DOUTB. The magnitude of the offset compensation voltage may correspond to the difference between voltages at the data output node DOUT and the complementary data output node DOUTB at a time point at which the sampling control signal SENB is in a rising edge.

The sense amplifier 160 may generate a sampling voltage based on the difference between the voltages of the complementary bit line BLB and the bit line BL. The magnitude of the sampling voltage may correspond to the difference in voltages of the complementary bit line BLB and the bit line BL at a time point at which the sampling control signal SENB is in a rising edge.

In embodiments, the offset compensation operation and the bit line sampling operation may be simultaneously performed.

In operation S120, the sense amplifier 160 may perform a sampling voltage transfer operation. For example, the sense amplifier 160 may turn on the first sampling transistor ST1 and the second sampling transistor ST2 based on the sampling control signal SENB.

As the first sampling transistor ST1 is turned on, the same change amount of voltage as the change amount of the voltage generated at the first sampling node NDS1 may be transmitted to the complementary data output node DOUTB. Similarly, as the second sampling transistor ST2 is turned on, the same change amount of voltage as the change amount of the voltage generated at the second sampling node NDS2 may be transmitted to the data output node DOUT.

In operation S130, the sense amplifier 160 may perform a sense operation. For example, the sense amplifier 160 may perform an operation of sensing data stored in the first memory cell 111 based on the difference between voltages at the data output node DOUT and the complementary data output node DOUTB.

In this case, the difference between voltages at the data output node DOUT and the complementary data output node DOUTB may mean a difference in voltages at the data output node DOUT and the complementary data output node DOUTB at a time point at which the sampling control signal SENB is in a falling edge. In this case, the difference between voltages at the data output node DOUT and the complementary data output node DOUTB may correspond to a value obtained by adding the offset compensation voltage to the sampling voltage in operation S110.

In operation S140, the sense amplifier 160 may perform a precharge operation. For example, by applying the precharge voltage VBL provided from the outside of the sense amplifier 160 to the sense amplifier 160, the voltage of the bit line BL, the voltage of the complementary bit line BLB, the voltage of the sense driving signal end LA, the voltage of the complementary sense driving signal end LAB, the voltage at the data output node DOUT, and the voltage at the complementary data output node DOUTB may be the precharge voltage VBL.

Figure 12:
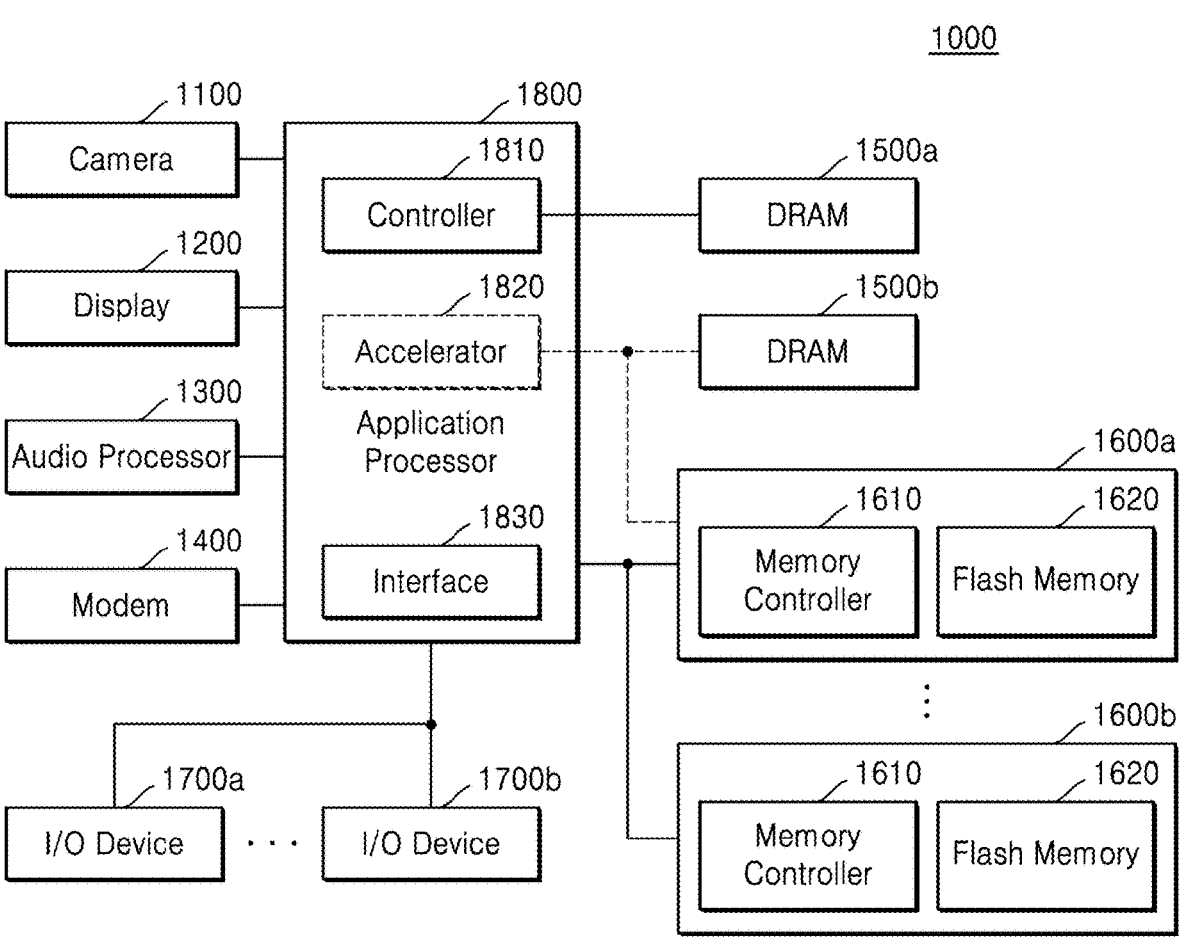
FIG. 12 is a block diagram of a system for describing an electronic device including a memory device according to an embodiment.

FIG. 12 is a block diagram of a system 1000 for describing an electronic device including a memory device according to an embodiment.

Referring to FIG. 12, the system 1000 may include a camera 1100, a display 1200, an audio processor 1300, a modem 1400, DRAMs 1500a and 1500b, flash memories 1600a and 1600b, I/O devices 1700a and 1700b, and an application processor (AP) 1800. The system 1000 may be implemented as, for example, a laptop computer, a mobile phone, a smartphone, a tablet personal computer (PC), a wearable device, a healthcare device, or an Internet of Things (IoT) device. In addition, the system 1000 may be implemented as a server or a PC.

The camera 1100 may capture a still image or video data under control of a user, and store and transmit the captured image/video data stored to the display 1200. The audio processor 1300 may process audio data included in the flash memories 1600a and 1600b or content of a network. The modem 1400 may modulate and transmit signals for wired/wireless data transmission and reception, and demodulate the signals to receive the original signal at a receiving side. The I/O devices 1700a and 1700b may include devices that provide digital input and/or output functions such as, for example, a Universal Serial Bus (USB) or storage, digital cameras, Secure Digital (SD) cards, a Digital Versatile Disc (DVD), a network adapter, a touch screen, etc.

The AP 1800 may control the overall operation of the system 1000. The AP 1800 may include a controller 1810, an accelerator block (or an accelerator chip 1820), and an interface block 1830. The AP 1800 may control the display 1200 so that some pieces of the content stored in the flash memories 1600a and 1600b are displayed on the display 1200. When a user input is received through the I/O devices 1700a and 1700b, the AP 1800 may perform a control operation corresponding to the user input. The accelerator block may be a dedicated circuit for computing artificial intelligence (AI) data. The accelerator chip 1820 may be disposed separately from the AP 1800 in an embodiment. The DRAM 1500b may be additionally mounted on the accelerator block or the accelerator chip 1820. The accelerator block is a function block that specializes in performing specific functions of the AP 1800, and the accelerator block may include, for example, a graphic processing unit (GPU), which is a function block that specializes in graphic data processing, a Natural Processing Unit (NPU), which is a function block that specializes in AI calculation and Inference, and a Data Processing Unit (DPU), which is a function block that specializes in data transmission.

The system 1000 may include a plurality of DRAMs 1500a and 1500b. The AP 1800 may control DRAMs 1500a and 1500b through command and mode register (MRS) settings that meet the Joint Electron Device Engineering Council (JEDEC) standards, or may configure a DRAM interface protocol for communication with DRAMs to use company-specific functions such as, for example, low voltage/high speed/reliability, and Cyclic Redundancy Check (CRC)/Error Correction Code (ECC) functions. For example, the AP 1800 may communicate with the DRAM 1500a through an interface that meets JEDEC standards such as LPDDR4, LPDDR5, and the like, and the accelerator block or accelerator chip 1820 may configure a new DRAM interface protocol for communication with the DRAMs, to control the DRAM 1500b for accelerators with higher bandwidth than the DRAM 1500a.

Although FIG. 12 shows only DRAMs 1500a and 1500b, any memory such as, for example, PRAM, SRAM, MRAM, RRAM, FRAM, or hybrid RAM may be used if the bandwidth, reaction speed, and voltage conditions of the AP 1800 or the accelerator block or accelerator chip 1820 are satisfied. The DRAMs 1500a and 1500b each have a latency and a bandwidth that are relatively less than the I/O devices 1700a and 1700b or the flash memories 1600a and 1600b. The DRAMs 1500a and 1500b are initialized at the power-on time point of the system 1000, and used as a temporary storage space of the operating system and the application data when the operating system and the application data are loaded, or used as an execution space of various pieces of software code.

Within DRAMs 1500a and 1500b, the four fundamental arithmetic operations such as addition/subtraction/multiplication/division, vector operations, address operations, or Fast Fourier Transform (FFT) operations may be performed. In addition, within the DRAMs 1500a and 1500b, functions for performance used for inference may be performed. Here, the inference may be performed in a deep learning algorithm using an artificial neural network. Deep learning algorithms may include a training operation of learning a model through a variety of data and an inference operation of recognizing data with a learned model. In an embodiment, an image taken by a user through the camera 1100 is signal-processed and stored in the DRAM 1500b, and the accelerator block or accelerator chip 1820 may perform an AI data calculation that recognizes data using data and functions used for inference, which are stored in the DRAM 1500b.

The system 1000 may include storages or flash memories 1600a and 1600b having a capacity greater than the DRAMs 1500a and 1500b. The accelerator block or accelerator chip 1820 may perform training operations and AI data calculations using the flash memories 1600a and 1600b. In an embodiment, the flash memories 1600a and 1600b include a memory controller 1610 and a flash memory 1620, and a training operation and an inference AI data operation performed by the AP 1800 and/or the accelerator chip 1820 may be performed more efficiently by using an operation device provided in the memory controller 1610. The flash memories 1600a and 1600b may store photos taken through the camera 1100 or may store data transmitted to the data network. For example, augmented reality/virtual reality, high definition (HD), or ultra-high definition (UHD) content may be stored.

In the system 1000, the DRAMs 1500a and 1500b may be memory devices including the sense amplifier described with reference to FIGS. 1 to 11. The sense amplifier may generate an offset compensation voltage through an offset compensation operation, and generate a sampling voltage through a bit line sampling operation. In this case, the offset compensation operation and the bit line sampling operation may be simultaneously performed. The sense amplifier may perform a sense operation based on the offset compensation voltage and the sampling voltage. In addition, the sense amplifier according to embodiments does not perform a restore operation. The sense amplifier according to embodiments may shorten the sense time utilized to read data stored in the memory cell of the memory device.

As is traditional in the field of the inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the inventive concept has been particularly shown and described with reference to embodiments thereof, it will be understood by those of ordinary skill in the art that various changes in form and detail may be made therein without departing from the spirit and scope of the inventive concept as defined by the following claims.

What is claimed is:

1. A sense amplifier that senses and amplifies data stored in a memory cell, the sense amplifier comprising:

a first sampling circuit including a first bit line capacitor connected to a bit line, a first sampling transistor connected between the bit line and a first sampling node, and a first decoupling capacitor connected between the first sampling node and a first data output node, wherein the first sampling circuit is configured to receive a first current through the bit line;

a second sampling circuit including a second bit line capacitor connected to a complementary bit line, a second sampling transistor connected between the complementary bit line and a second sampling node, and a second decoupling capacitor connected between the second sampling node and a second data output node, wherein the second sampling circuit is configured to receive a second current through the complementary bit line; and a sense amplification circuit connected between the first data output node and the second data output node and configured to generate an offset compensation voltage that compensates for an offset between the first data output node and the second data output node through an offset compensation operation, wherein the first sampling circuit is configured to provide, to the first data output node, a sampling voltage generated by performing a sampling operation based on a sampling control signal, and the sense amplification circuit performs the offset compensation operation while the first sampling circuit performs the sampling operation.

2. The sense amplifier of claim 1, wherein a magnitude of the offset compensation voltage corresponds to a difference between voltages at the second data output node and the first data output node when a logic level of the sampling control signal is in a rising edge.

3. The sense amplifier of claim 1, wherein a magnitude of the sampling voltage corresponds to a difference between voltages of the bit line and the complementary bit line when a logic level of the sampling control signal is in a rising edge.

4. The sense amplifier of claim 1, wherein the sense amplification circuit performs a sensing operation that senses data stored in the memory cell based on a difference between voltages at the first data output node and the second data output node when a logic level of the sampling control signal is in a falling edge, and the difference between the voltages at the first data output node and the second data output node corresponds to a sum of the offset compensation voltage and the sampling voltage.

5. The sense amplifier of claim 4, wherein, when the sense amplification circuit performs the sensing operation, both a first end and a second end of the first sampling transistor are not electrically connected to each other.

6. The sense amplifier of claim 1, wherein, when data stored in the memory cell has a first value, the first current is greater than the second current, and when the data stored in the memory cell has a second value, the first current is less than the second current.

7. The sense amplifier of claim 1, wherein the sense amplification circuit further comprises a precharge equalizing transistor configured to provide a precharge voltage to the sense amplification circuit based on a precharge equalizing signal, and to provide the precharge voltage to the first data output node and the second data output node.

8. The sense amplifier of claim 7, further comprising:
a first precharge transistor electrically connected to the first data output node and the first sampling node; and
a second precharge transistor electrically connected to the second data output node and the second sampling node, wherein
the first precharge transistor provides the precharge voltage to the first sampling node, and
the second precharge transistor provides the precharge voltage to the second sampling node.

9. A sense amplifier that senses and amplifies data stored in a memory cell, the sense amplifier comprising:
a first sampling circuit including a first bit line capacitor connected to a bit line, a first sampling transistor connected between the bit line and a first sampling node, and a first decoupling capacitor connected between the first sampling node and a first data output node, and configured to receive a first current through the bit line;
a second sampling circuit including a second bit line capacitor connected to a complementary bit line, a second sampling transistor connected between the complementary bit line and a second sampling node, and a second decoupling capacitor connected between the second sampling node and a second data output node, and configured to receive a second current through the complementary bit line; and
a first precharge transistor connected to the first sampling node and configured to provide a first precharge voltage to the first sampling node based on a precharge transistor control signal;
a second precharge transistor connected to the second sampling node and configured to provide the first precharge voltage to the second sampling node based on the precharge transistor control signal; and
a sense amplification circuit connected between the first data output node and the second data output node and configured to generate an offset compensation voltage that compensates for an offset between the first data output node and the second data output node through an offset compensation operation, wherein
the first sampling circuit is configured to provide, to the first data output node, a sampling voltage generated by performing a sampling operation based on a sampling control signal, and
the sense amplification circuit performs the offset compensation operation while the first sampling circuit performs the sampling operation.

10. The sense amplifier of claim 9, wherein a magnitude of the offset compensation voltage corresponds to a difference between voltages at the second data output node and the first data output node when a logic level of the sampling control signal is in a rising edge.

11. The sense amplifier of claim 9, wherein a magnitude of the sampling voltage corresponds to a difference between voltages of the bit line and the complementary bit line when a logic level of the sampling control signal is in a rising edge.

12. The sense amplifier of claim 9, wherein the sense amplification circuit performs a sensing operation that senses data stored in the memory cell based on a difference between voltages at the first data output node and the second data output node when a logic level of the sampling control signal is in a falling edge, and the difference between the voltages at the first data output node and the second data output node corresponds to a sum of the offset compensation voltage and the sampling voltage.

13. The sense amplifier of claim 12, wherein, when the sense amplification circuit performs the sensing operation, both a first end and a second end of the first sampling transistor are not electrically connected to each other.

14. The sense amplifier of claim 12, wherein, when data stored in the memory cell has a first value, the first current is greater than the second current, and when the data stored in the memory cell has a second value, the first current is less than the second current.

15. The sense amplifier of claim 12, wherein the sense amplification circuit further comprises a precharge equalizing transistor configured to provide a second precharge voltage to the sense amplification circuit based on a precharge equalizing signal, and to provide the second precharge voltage to the first data output node and the second data output node.

16. The sense amplifier of claim 15, wherein the first precharge voltage is greater than the second precharge voltage.

17. A method of operating a sense amplifier that senses and amplifies data stored in a memory cell, wherein
the sense amplifier includes a first sampling circuit connected to a bit line, a second sampling circuit connected to a complementary bit line, and a sense amplification circuit connected between a first data output node and a second data output node, the method comprising:
generating an offset compensation voltage that compensates for an offset between the first data output node and the second data output node;
generating a sampling voltage corresponding to a voltage difference between the bit line and the complementary bit line;
providing the sampling voltage to the first data output node based on a sampling control signal;
performing a sensing operation of sensing data stored in the memory cell based on a difference between voltages of the first data output node and the second data output node; and
performing a precharge operation by applying a precharge voltage to the sense amplifier.

18. The method of claim 17, wherein a magnitude of the offset compensation voltage corresponds to a difference between voltages at the second data output node and the first data output node when a logic level of the sampling control signal is in a rising edge.

19. The method of claim 18, wherein a magnitude of the sampling voltage corresponds to a difference between voltages of the bit line and the complementary bit line when the logic level of the sampling control signal is in the rising edge.

20. The method of claim 17, wherein a first current is provided to the first sampling circuit through the bit line, a second current is provided to the second sampling circuit through the complementary bit line, when data stored in the memory cell has a first value, the first current is greater than the second current, and when the data stored in the memory cell has a second value, the first current is less than the second current.

\* \* \* \* \*